United States Patent
Stadler

(10) Patent No.: US 6,714,002 B2
(45) Date of Patent: Mar. 30, 2004

(54) INTEGRATED SEMICONDUCTOR CIRCUIT AND MULTI-CHIP MODULE WITH A PLURALITY OF INTEGRATED SEMICONDUCTOR CIRCUITS

(75) Inventor: Walter Stadler, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/146,160

(22) Filed: May 15, 2002

(65) Prior Publication Data

US 2002/0175348 A1 Nov. 28, 2002

(30) Foreign Application Priority Data

May 16, 2001 (DE) .......................................... 101 23 758

(51) Int. Cl.[7] ................................................. G01R 1/04
(52) U.S. Cl. ..................................... 324/158.1; 257/48
(58) Field of Search ................................ 324/765, 763, 324/158.1, 754, 769; 257/48, 210, 207; 438/14, 16, 17, 18; 254/48, 210, 207

(56) References Cited

U.S. PATENT DOCUMENTS 5,453,991 A * 9/1995 Suzuki et al. ............... 714/724
5,646,422 A * 7/1997 Hashizume .................. 257/48
6,548,910 B2 * 4/2003 Kawai ......................... 257/84

FOREIGN PATENT DOCUMENTS

DE          197 44 818 A1    10/1998

* cited by examiner

Primary Examiner—David A. Zarneke
Assistant Examiner—Jimmy Nguyen
(74) Attorney, Agent, or Firm—W. Daniel Swayze, Jr.; W. James Brady; Frederick J. Telecky, Jr.

(57) ABSTRACT

An integrated semiconductor circuit (10) with function inputs (14a) and function outputs (16a), as well as with function units (12), which supply the function outputs (16a) with output signals which they generate as a function of the input signals applied to the function inputs (14a), including test inputs (18) and test outputs (20), as well as an interface unit (22, 26) which is inserted between the function units (12), on the one hand, and some of the function inputs (14a) and some of the function outputs (16a). The interface unit (22, 26) can be switched over, by means of test control signals applied to it, in such a way that it connects these several function inputs (14a) to the test outputs (20) or to the function units (12), and these several function outputs (16a) to the test inputs (18) or to the function units (12). A multi-chip module can be assembled on a common substrate (30) from a plurality of such integrated semiconductor circuits (10, 32), whereby the interface units of the semiconductor circuits contained in the multichip module make it possible to check these individual semiconductor circuits.

1 Claim, 4 Drawing Sheets

INTEGRATED SEMICONDUCTOR CIRCUIT AND MULTI-CHIP MODULE WITH A PLURALITY OF INTEGRATED SEMICONDUCTOR CIRCUITS

FIELD OF THE INVENTION

The invention relates to an integrated semiconductor circuit with function inputs and function outputs, as well as with function units, which supply the function outputs with output signals which they generate as a function of the input signals applied to the function inputs, as well as to a multi-chip module with a plurality of such integrated semiconductor circuits.

BACKGROUND OF THE INVENTION

Conventional circuits, embodied as integrated circuits, can be used for the realisation of a great variety of different applications. They can process, for example, digital or analogue signals at low or high power; the frequency of the signals to be processed being in the audio or even in the high frequency range. For the purpose of optimising the integrated circuit to suit the intended application, different technologies are applied in their manufacture. These technologies are so different from each other that it is only possible to a limited extent to integrate the function units assigned to these different application ranges on one single semiconductor chip. It is therefore normal practice to produce every one of the integrated semiconductor circuits by using the technology most suited to the intended application, and then to arrange a plurality of such integrated circuits within a multi-chip module, on a common substrate, where they are then interconnected by using conventional procedures. The multi-chip module is a selfcontained unit, with module inputs and module outputs, that has to be tested for full functionality once the manufacturing process is complete. It is, of course, possible to test the functionality of the individual integrated semiconductor circuits before they are attached to the common substrate, but this does not ensure that they remain fully functional after they have been attached to the substrate and after the connections with the other semiconductor circuits have been established.

As well as the individual integrated semiconductor circuits themselves, also the connections in the multi-chip module on the common substrate can be faulty, making it necessary to create the means to check both the individual integrated semiconductor circuits on the substrate, as well as the connections between the semiconductor circuits for faults.

SUMMARY OF THE INVENTION

The invention rests on the requirement of creating an integrated semiconductor circuit of the type indicated above which, when used in conjunction with further similar integrated semiconductor circuits within a multi-chip module, enables all required tests on both the individual integrated semiconductor circuits as well as their interconnections to be carried out.

According to the invention, this requirement is met in an integrated semiconductor circuit of the type indicated above in that by means of test inputs and test outputs, as well as an interface unit, which is inserted between the function units on the one hand, and some of the function inputs and some of the function outputs on the other hand and, by means of test control signals applied to it, can be switched over that it connects these several function inputs to the test outputs or to the function units, and these several function outputs to the test inputs or to the function units.

A multi-chip module with several integrated semiconductor circuits, according to the invention, on a common substrate with a plurality of module outputs, module inputs, module test inputs and module test outputs is characterised in that at least some of the function inputs of at least one integrated semiconductor circuit are connected to at least some function outputs of at least one further integrated semiconductor circuit integrated semiconductor circuit, that at least some of the function outputs of at least one integrated semiconductor circuit are connected to at least some function inputs of at least one further integrated semiconductor circuit, that the test inputs and the test outputs of the integrated semiconductor circuits are connected to the module test inputs or to the module test outputs, respectively, and that the test control signals can be applied to the interface units of the integrated semiconductor circuits by means of additional test control inputs.

The interface unit provided in the integrated semiconductor circuit makes it possible, in a first switching state determined by the test control signal, to allow the integrated semiconductor circuit to operate in its normal mode in that it processes the input signals, which it receives at its inputs, in the function units, and then again outputs the corresponding output signals at its function outputs. In the second switching state of the interface unit, the function outputs and the function inputs are disconnected from the corresponding terminals of the function units, and are connected to test inputs or test outputs, respectively. On account of this switch-over capability of the interface unit, the integrated semiconductor circuit, in this state of the interface unit, can be used as input/output interface unit for a similarly embodied integrated semiconductor circuit within a multi-chip module, that is to be tested. Test input signals can therefore be applied to each further integrated semiconductor circuit via this input/output interface, which are then processed in their function units, and can be output and tested via the test outputs of the semiconductor circuit which in this case only acts as an input/output interface. Because of the particular embodiment of the integrated semiconductor circuits, it becomes therefore possible to test such circuits individually within a multi-chip module.

BRIEF DESCRIPTION OF THE DRAWINGS

The invention shall now be explained in exemplified form, with reference to the drawings where.

DETAILED DESCRIPTION OF THE DRAWINGS

Figure 1:
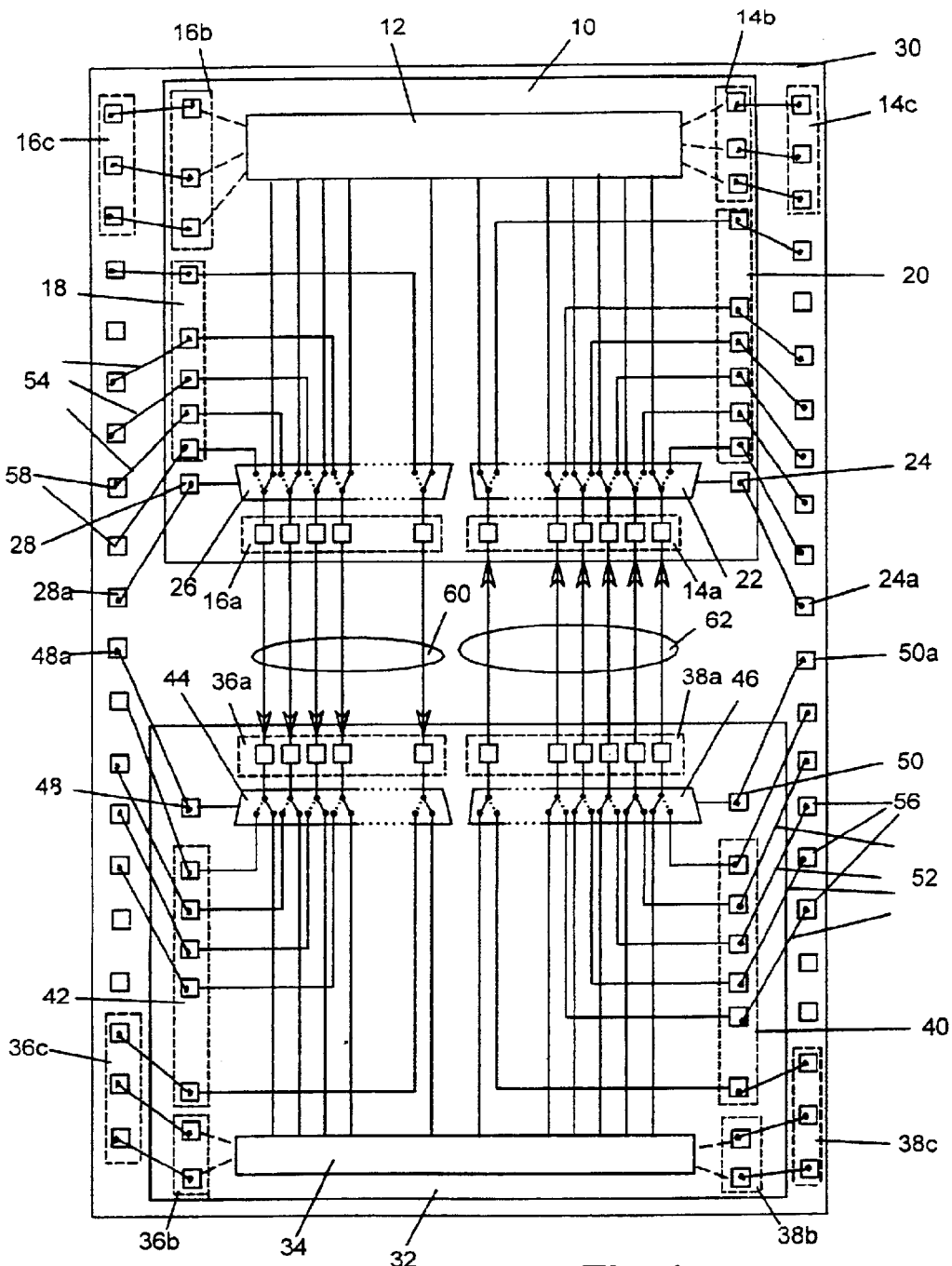
FIG. 1 shows a schematic of an integrated semiconductor circuit in a multi-chip module in conjunction with a second similar integrated semiconductor circuit.

FIG. 1 shows an integrated semiconductor circuit 10. This semiconductor circuit contains function units 12, represented in block form, where the signal processing takes place, for which the semiconductor circuit 10 is intended. The semiconductor circuit 10 is normally a semiconductor wafer or chip in which are embodied the function units 12 by making use of the optimum integration technology for the applications concerned. On the semiconductor circuit 10 there are function inputs 14a and 14b, to which can be applied the input signals to be fed to the function units 12. The semiconductor circuit 10 furthermore contains the function outputs 16a and 16b at which the output signals of the function units 12 are output. In addition to these function inputs and function outputs, the semiconductor circuit 10 is provided with test inputs 18, as well as with test outputs 20, the purpose of which shall be explained later on. An interface unit 22 is inserted between the function inputs 14a and the function units 12 which, as can be appreciated from FIG. 1, consists of individual switch-over devices by means of which, depending on their position, a connection can be established between the respective function input 14a and a corresponding connection of the function units 12, or between the function input 14a and a test output 20. The position of the switch-over devices is determined by means of a control signal which can be applied to a control input 24.

In the same way, an interface unit 26 is also inserted between the function outputs 16a and the function units 12, which like the interface unit 22 consists of individual switch-over devices. Depending on the position of these switch-over devices, outputs of the function units 12 can be connected to the corresponding function outputs 16a, or a connection between a function output 16a and a corresponding test output 18 can be established. The position of the switch-over devices is determined by means of a control signal, which can be applied to a control input 28.

The semiconductor circuit 10 is formed on a substrate 30 on which is also located a second integrated semiconductor circuit 32, so that the entire arrangement represented in FIG. 1 forms a multi-chip module. The embodiment of the integrated semiconductor circuit 32 is essentially identical to that of the semiconductor circuit 10. It contains the main basic elements; its function units 34 are, of course, different from the function units 12 of the semiconductor circuit 10 and, accordingly, are intended for different application duties. Like the semiconductor circuit 10, the semiconductor circuit 34 also contains function inputs 36a and 36b, as well as function outputs 38a and 38b. Test inputs 40 and test outputs 42 are equally provided. The interface units 44 and 46, which according to the representation consist of individual switch-over devices, fulfil the same functions as those in the semiconductor circuit 10. The interface units 44 and 46 can also be controlled by means of control signals which can be applied to the control inputs 48 or 50, respectively. Both the inputs and the outputs of the semiconductor circuits 10 and 32 on the substrate 30 are connected by means of bonding wires 52, 54 to the corresponding contacting surfaces 56, 58 on the substrate 30. Only these contacting surfaces 56, 58 are accessible from the outside when the multi-chip module in its finished form is enclosed in its housing. The function outputs 16a of the semiconductor circuit 10 are connected by means of bonding wires 60 to the function inputs 36a of the semiconductor circuit 32, whilst the function outputs 38a are connected by means of bonding wires 62 to the function inputs 14a of the semiconductor circuit 10.

As has been mentioned above, the function inputs 14a, 36a and the function outputs 16a, 38a of both the semiconductor circuits 10, 32 are no longer accessible from the outside once the multi-chip module is complete, so that it is no longer possible to test these semiconductor circuits as to their functionality, either by the direct application of test signals to these function inputs, or by the analysis of the output signals produced at the function outputs. The insertion of the interface units 22, 26, 44 and 46 in the semiconductor circuits not only allows the individual semiconductor circuits to be individually tested, but it becomes also possible to check that the internal connections, established by means of the bonding wires 60, 62, are free from faults. The actual testing procedures shall now be explained in more detail.

Figure 2:
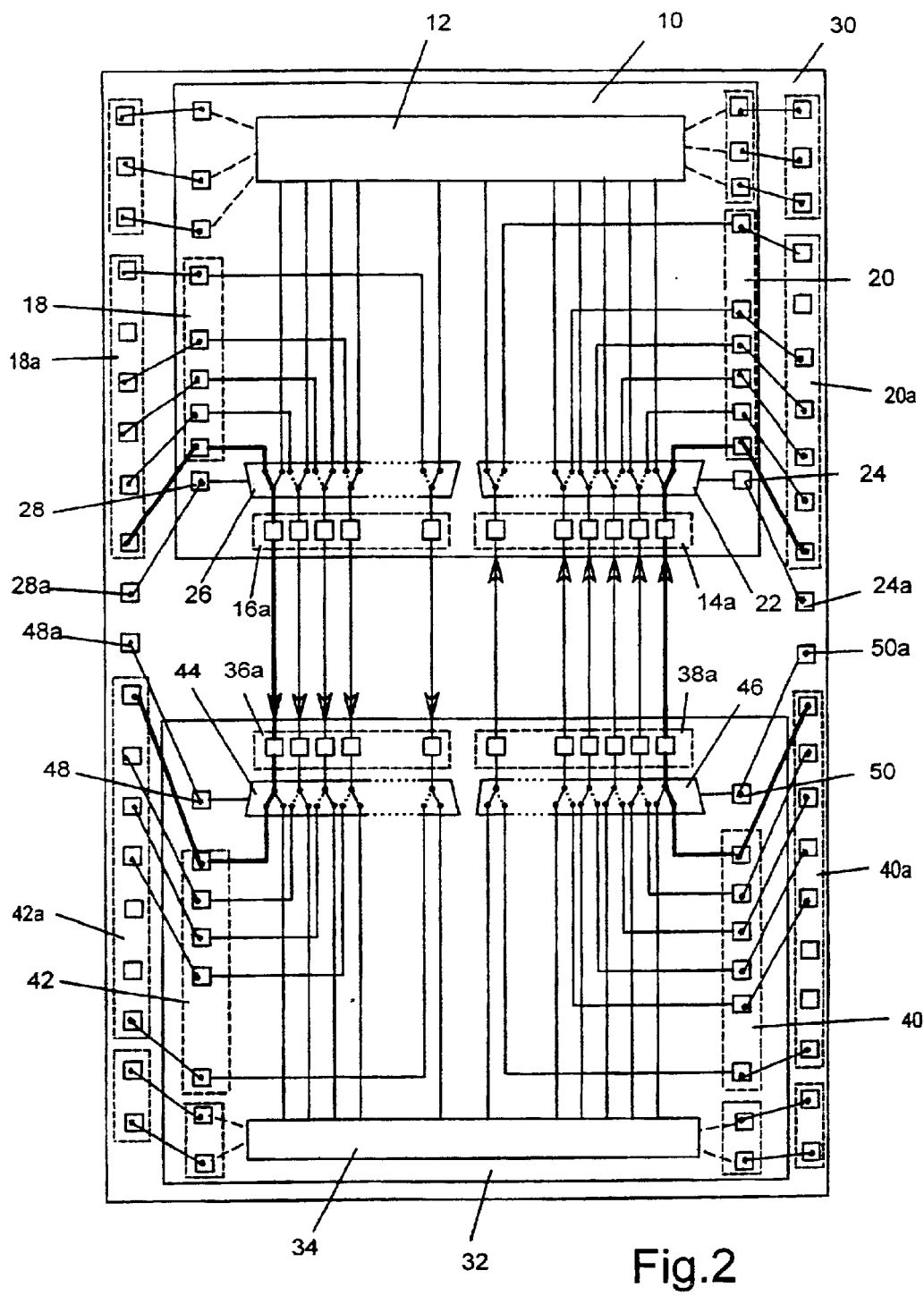
FIG. 2 shows the multi-chip module of FIG. 1, with switching states of the interface units for testing the connections between the integrated semiconductor circuits.

Making reference to FIG. 2, it shall be explained initially how the condition of the connections between the semiconductor circuits 10 and 32, established by means of the bonding wires 60, 62 (see FIG. 1) can be checked. To this end, the switch-over devices in the interface unit 22 are set into the position represented by the dotted line, which causes a corresponding control signal to be applied to the control input 24 via the externally accessible control input 24a and the corresponding bonding wire. The switch-over devices in the interface unit 26 are also brought into the position represented by dotted lines, by means of a corresponding control signal to the externally accessible control input 28a, the switch-over devices in the interface unit 44 are brought into the position represented by dotted lines, by means of a corresponding control signal applied to the externally accessible control input 48a, and the switch-over devices in the interface unit 46 are brought into the position represented by dotted lines, by means of a corresponding control signal applied to the externally accessible control input 50a. Once the switch-over devices in the interface units 22, 26, 44 and 46 are thus positioned, there will be direct connections, at any given time, between the test inputs 18 of the semiconductor circuit 10 and the test outputs 42 of the semiconductor circuit 32, as well as between the test inputs 40 of the semiconductor circuit 32 and the test outputs 20 of the semiconductor circuit 10. In FIG. 2, one of these connections, in each case, is emphasized by bold lines. When the connection of the bonding wires 60 and 62 (see FIG. 1) has been achieved free of faults, a test signal applied to the respective test inputs of one of the semiconductor circuit will be available from the corresponding test output of the other semiconductor circuit. Should no signal be present at the test output, it means that the connection made with the bonding wire is interrupted. This test, of course, also shows a fault when one of the bonding connections between the externally accessible test inputs 40a, 18a and the test outputs 42a, 20a on the substrate 30, and the internal test inputs 42, 18 or 40, 20, respectively, on the semiconductor circuits 10 or 32, respectively, proves faulty.

Figure 3:
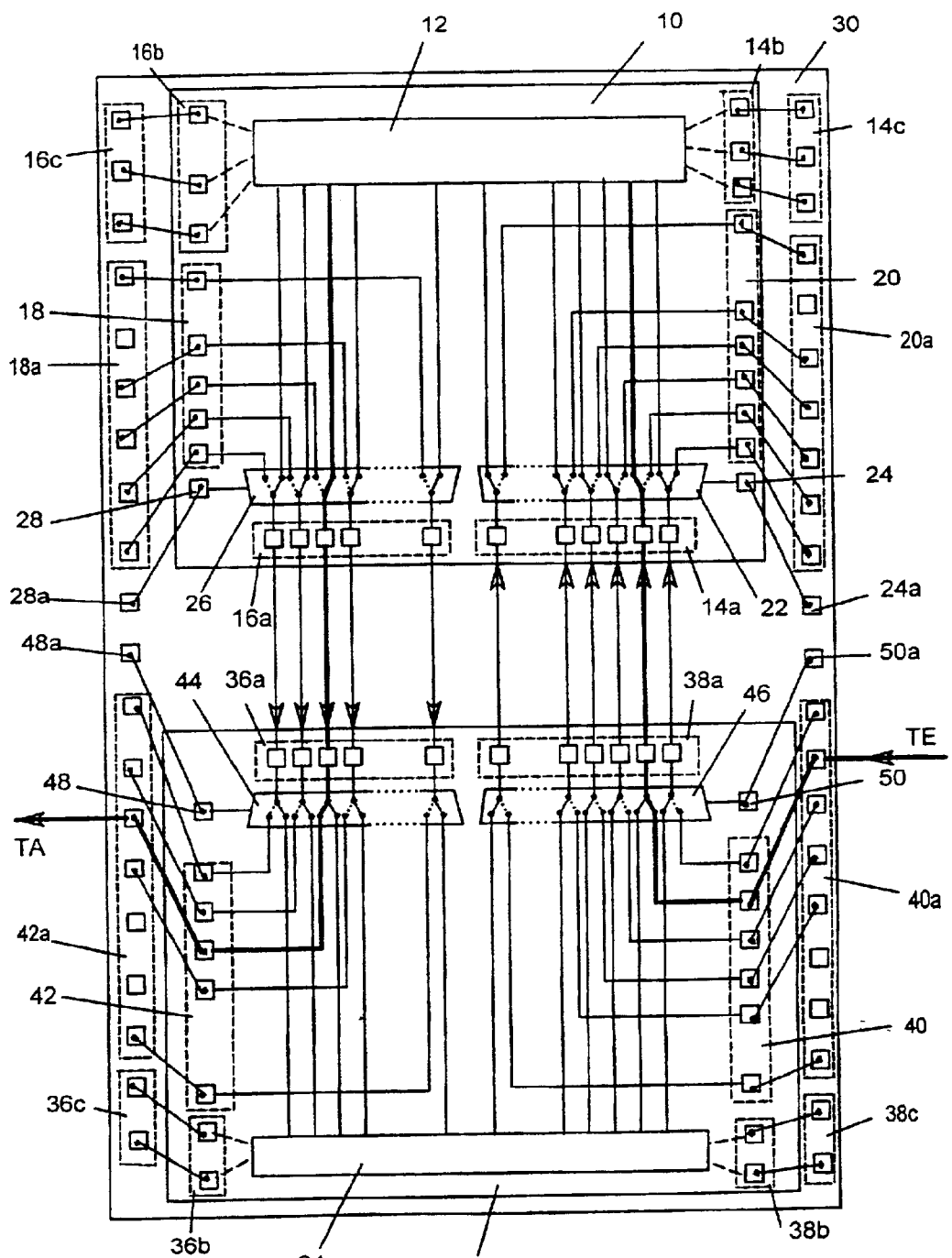
FIG. 3 shows the multi-chip module with switching states of the interface units for testing the integrated semiconductor circuit.

With reference to FIG. 3, it shall now be explained how the functionality of the function units 12 in the semiconductor circuit 10 can be tested.

The switch-over devices in the interface units 22, 26 will be taken into the positions shown in unbroken lines by the application of control signals to them inputs 24a or 28a, respectively. In this position, the function inputs 14a are connected to the function units 12 via the interface unit 22, and the function outputs 16a are also connected to the function units 12 via the interface unit 26. This is the normal state for the interface units 22 and 26, which they also take up when the multi-chip module operates in its intended application. In the semiconductor circuit 32, however, the switch-over devices in the interface units 44 and 46 have been taken into the positions indicated by dotted lines by the application of corresponding control signals to the inputs 48a and 50a, whereby the function units 34 are disconnected from the function inputs 36a and from the function outputs 38a. The interface units 44 and 46 rather establish connections between the function outputs 38a and the test inputs 40, as well as between the function inputs 44 and the test outputs 42. By way of the externally accessible test inputs 40a on the substrate 30 of the multi-chip module it is therefore possible to apply test signals via the interface unit 46, the function outputs 38a, the bonding wires 62, the function inputs 14a and the interface unit 22 to the function units 12. The output signals generated by these function units can be passed on, via the interface unit 26, the function outputs 16a, the bonding wires 60, the function inputs 36a and the interface unit 44, to the test outputs 42, which are connected by bonding wires to the corresponding test outputs 42a on the substrate 30 of the multi-chip module. This means that the function units 12 in the semiconductor circuit 10 can be checked for correct functionality by the application of test signals which do not originate from the function units 34 of the semiconductor circuit 32, but which are applied from an external source. The semiconductor circuit 10 can therefore be tested independently from the semiconductor circuit 32, whereby only the interface units 44 and 46 of the semiconductor circuit 32 are involved in this test procedure.

In FIG. 3, a signal path of a test input signal TE is represented as a bold line, whereby this test input signal causes the generation of a test output signal TA. It becomes possible to test, in a very flexible way, the function units 12 in the semiconductor circuit 10 by the application of any chosen test signals to the test inputs via the interface unit 46 and, of course, also by the application of test signals to the function inputs 14b, externally accessible via the inputs 14c on the substrate 30 of the multi-chip module and the bonding wires, for their functionality. The output signals generated as a reaction to the applied input signals cannot only be picked off from the test outputs connected via the interface unit 44, but also from the outputs 16c which are connected to the function outputs 16b by means of bonding wires.

Figure 4:
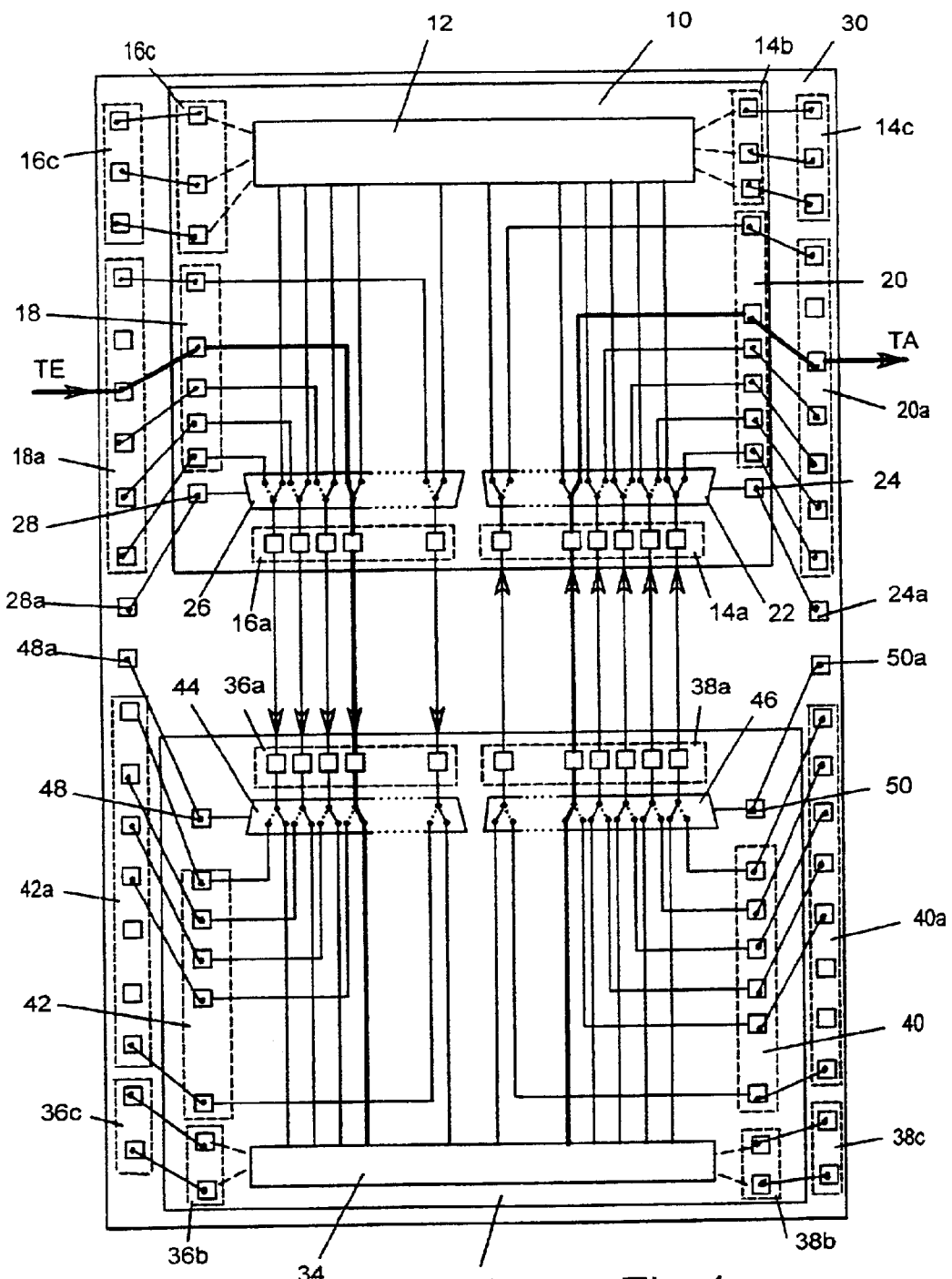
FIG. 4 shows the multi-chip module with switching states of the interface units for testing the integrated semiconductor circuit.

FIG. 4 shows in a corresponding manner how the function units 34 of the semiconductor circuit 32 can be checked for their functionality by inclusion of the interface units 22 and 26 in the semiconductor circuit 10. By the application of corresponding control signals to the control inputs 24a and 28a, the switch-over devices in these interface units are taken into the position represented as a dotted line, whereby the function units 12 in the semiconductor circuit 10 are disconnected from the function inputs 14a or from the function outputs 16a, respectively. The switch-over devices in the interface units 44 and 46 are taken into the position indicated by unbroken lines by the application of corresponding control signals to the inputs 50a or 48a, respectively, where, as under normal application conditions of the multi-chip module, the function inputs 36a and the function outputs 38a are connected to the function units 34 in the semiconductor circuit 32. By the application of test signals to the test inputs 18, which are through-connected to the function units 34 in the semiconductor circuit 32 by way of the interface unit 26 and the interface unit 34, corresponding output signals become available at the function outputs 38a, which are then passed on to the test outputs 20 via the function inputs 14a and the interface unit 22. By the application of appropriate test input signals the functional capability of the function units 34 can be checked by analyzing the test output signals generated. In the case of FIG. 3, test signals can, of course, also be applied to the function units 34 via the further function inputs 36b which are externally accessible via corresponding inputs 36c at the multi-chip module. Test output signals can also be taken from the function outputs 38b which are directly externally accessible via outputs 38c.

Bold lines in FIG. 4 show the path taken by a test signal TE from a test input 18 via the interface unit 26, a function output 16a, a function input 36a, the interface unit 44, the function units 32, the interface unit 46, a function output 38a, a function input 14a and the interface unit 22 to a test output.

The resulting output signal TA then becomes available at the multi-chip module.

Since the number of input and output connections that can be accommodated on the substrate 30 of the multi-chip module is limited for reasons of space, it can be arranged that, in an advantageous modification, those function inputs and function outputs of the integrated semiconductor circuits 10, 32, which in the embodiment example described are connected directly to the function units 12 or 34, respectively, can also be put to use as test inputs or test outputs, respectively. In this way, the number of the test inputs and test outputs to be accommodated on the substrate can be reduced. In order to achieve this, a switch-over device must be inserted in each case in the connections between the function inputs 14b and the function units 12, and in the connections between the function inputs 36b and the function units 32, which makes it possible to feed a test signal, applied to the respective function input, to either the integrated semiconductor circuit 32 or 10, respectively, by way of the interface unit 26 or the interface unit 46, respectively. To ensure that the function outputs 16b and 38b can also be used as test outputs, a switch-over device may also be inserted in the connections between these outputs and the function units 12 or 34, respectively, which makes it possible not to output the output signals of the function units 12 or 34, respectively, at these outputs, but, as in the test procedure described above, the output signals of the function units 34 or 12, respectively, which originate from the function outputs 38a or 16a, respectively, of the correspondingly other integrated semiconductor circuit. In test mode it is therefore possible to feed a test signal applied to a function input 14b, by way of a corresponding switch-over device, from a function output 16a to a function input 36a of the integrated semiconductor circuit 32, and from there to the function units 34, whereupon these generate a corresponding output signal which then becomes available as a test output signal by way of the function outputs 38b or the function outputs 38a and the test outputs 20. The function inputs can, therefore, act as test inputs when the switch-over devices are in their respective positions. Furthermore, when the newly added switch-over devices are set into their corresponding positions, it becomes, for example, possible for an output signal generated by the function units 12 via the function inputs 36a as a reaction of a test signal, not to become externally accessible from the specially provided test outputs 42, but to be fed to the function outputs 38b, so that it becomes available via the outputs 38c. In this case, the function outputs 38b are used as test outputs, so that the number of connections to be provided for the test outputs on the substrate 30 can be reduced.

The multi-chip module represented in the drawings only contains two semiconductor circuits 12 and 32, but the testing principle described can also be applied to multi-chip modules comprising more than two semiconductor circuits. To this end, each one of these semiconductor circuits is provided with corresponding interface units and so makes it possible to check the function units in each of the existing semiconductor circuits by means of test signals which are not generated by other semiconductor circuits, but which are applied by way of individual test inputs. Signal application is thereby in each case by inclusion of interface units of semiconductor circuits, the function units of which are not being tested at the moment. The composition of the semiconductor circuits with interface units as described, therefore, opens the way to very flexible testing possibilities of the function units in semiconductor circuits of multi-chip modules which are already encased in a housing, that is to say at modules complete and ready for immediate use in the intended application.

What is claimed is:

1. An integrated circuit having a first semiconductor circuit and a second semiconductor circuit on a common substrate to form a module having module inputs and module outputs, comprising:

said first semiconductor circuit including first function units, first function inputs, and first function outputs, having first input signals applied to said first function inputs to generate first output, first test inputs, first test output signals from said first input signals, said second semiconductor circuit including second function units, second function inputs, and second function outputs, having second signals applied to said second function input to generate second output signals from said second input signals and having first test inputs and second test outputs, interface units being positioned between the first function units and the second function units, said first function input of said first semiconductor circuit being connected to second function outputs of said second semiconductor circuit, and said first function outputs of said first semiconductor circuit being connected to said second function inputs of said second semiconductor circuit;

first and second test inputs and first and second test outputs of the first and second semiconductor circuits are connected to said module test inputs or to module test outputs respectively, and test control signals can be applied to said first and second interface units of the first and second semiconductor circuit by test control inputs.

* * * * *